United States Patent
E Afandi et al.

(10) Patent No.: US 12,266,628 B2
(45) Date of Patent: Apr. 1, 2025

(54) SEMICONDUCTOR PACKAGE HAVING A METAL CLIP AND RELATED METHODS OF MANUFACTURING

(71) Applicant: Infineon Technologies AG, Neubiberg (DE)

(72) Inventors: Engku Izyan Munirah E Afandi, Selangor (MY); Wee Peng Chong, Melaka (MY); Joel Feliciano Del Rosario, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 423 days.

(21) Appl. No.: 17/885,184

(22) Filed: Aug. 10, 2022

(65) Prior Publication Data

US 2024/0055387 A1 Feb. 15, 2024

(51) Int. Cl.
*H01L 23/00* (2006.01)
*H01L 23/495* (2006.01)

(52) U.S. Cl.
CPC ........ *H01L 24/40* (2013.01); *H01L 23/49513* (2013.01); *H01L 23/49524* (2013.01); *H01L 23/49541* (2013.01); *H01L 24/05* (2013.01); *H01L 24/84* (2013.01); *H01L 2224/05552* (2013.01); *H01L 2224/4007* (2013.01); *H01L 2224/40245* (2013.01); *H01L 2224/84801* (2013.01)

(58) Field of Classification Search
CPC ............... H01L 24/40; H01L 23/49513; H01L 23/49524; H01L 24/84

USPC ......................................................... 257/690
See application file for complete search history.

(56) References Cited

U.S. PATENT DOCUMENTS

| | | |
|---|---|---|
| 5,132,772 A | 7/1992 | Fetty |
| 2002/0125562 A1 | 9/2002 | Crowley et al. |
| 2003/0075785 A1 | 4/2003 | Crowley et al. |
| 2006/0012055 A1 | 1/2006 | Foong et al. |
| 2007/0075406 A1 | 4/2007 | Ho et al. |
| 2009/0008775 A1 | 1/2009 | Tanaka et al. |
| 2014/0361420 A1 | 12/2014 | Yilmaz et al. |
| 2017/0338190 A1 | 11/2017 | Fujino et al. |
| 2019/0311975 A1* | 10/2019 | Choi ................... H01L 23/3107 |
| 2020/0176342 A1 | 6/2020 | Choi et al. |

(Continued)

FOREIGN PATENT DOCUMENTS

| | | |
|---|---|---|
| WO | 2011117939 A1 | 9/2011 |
| WO | 2020127442 A2 | 6/2020 |

*Primary Examiner* — Quoc D Hoang
(74) *Attorney, Agent, or Firm* — Murphy, Bilak & Homiller, PLLC (57) ABSTRACT

A semiconductor package includes: a semiconductor die attached to a lead frame and having a first bond pad at a side of the semiconductor die facing away from the lead frame; a metal clip having a first bonding region attached to the first bond pad by a solder joint, the metal clip providing an electrical pathway to the first bond pad; and an additional electrical pathway to the first bond pad. A first end of the additional electrical pathway is attached to the first bond pad. At one or more locations between the first end and a second end of the additional electrical pathway, the additional electrical pathway is attached to a surface of the first bonding region of the metal clip that faces away from the first bond pad. Methods of producing the semiconductor package are also described.

23 Claims, 5 Drawing Sheets

(56) References Cited

U.S. PATENT DOCUMENTS

2021/0091054 A1    3/2021   Apelsmeier et al.
2022/0352056 A1   11/2022   Bajuri et al.

\* cited by examiner

SEMICONDUCTOR PACKAGE HAVING A METAL CLIP AND RELATED METHODS OF MANUFACTURING

BACKGROUND

Many types of power semiconductor packages utilize metal clips for connecting a power terminal of a semiconductor die such as a source or emitter terminal of a power transistor die to a lead of the package. The metal clip is typically attached to the power terminal of the semiconductor die using solder. However, as transistor die sizes shrink, insufficient clearance/space may be available to prevent solder bleed-out from under the metal clip contacting a gate terminal of the semiconductor die, rendering the die inoperable. Such a shorting risk problem becomes more severe for power semiconductor technologies such as SiC and GaN which allow for smaller bond pad sizes (e.g., up to 30% smaller compared to Si) with higher current density.

Thus, there is a need for an improved power semiconductor package that utilizes a metal clip but is more robust against shorting caused by solder bleed-out.

SUMMARY

According to an embodiment of a semiconductor package, the semiconductor package comprises: a semiconductor die attached to a lead frame and having a first bond pad at a side of the semiconductor die facing away from the lead frame; a metal clip having a first bonding region attached to the first bond pad by a solder joint, the metal clip providing an electrical pathway to the first bond pad; and an additional electrical pathway to the first bond pad, wherein a first end of the additional electrical pathway is attached to the first bond pad, wherein at one or more locations between the first end and a second end of the additional electrical pathway, the additional electrical pathway is attached to a surface of the first bonding region of the metal clip that faces away from the first bond pad.

According to an embodiment of a method of producing a semiconductor package, the method comprises: attaching a semiconductor die to a lead frame, the semiconductor die having a first bond pad at a side of the semiconductor die facing away from the lead frame; attaching a first bonding region of a metal clip to the first bond pad by a solder joint, the metal clip providing an electrical pathway to the first bond pad; attaching a first end of an additional electrical pathway to the first bond pad; and at one or more locations between the first end and a second end of the additional electrical pathway, attaching the additional electrical pathway to a surface of the first bonding region of the metal clip that faces away from the first bond pad.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B illustrate an embodiment of a semiconductor package having a metal clip, where FIG. 1A shows a top plan view of the semiconductor package and FIG. 1B shows a cross-sectional view of the semiconductor package along the line labelled A-A' in FIG. 1A.

FIGS. 2A and 2B illustrate another embodiment of a semiconductor package having a metal clip, where FIG. 2A shows a top plan view of the semiconductor package and FIG. 2B shows a cross-sectional view of the semiconductor package along the line labelled B-B' in FIG. 2A.

FIGS. 3A and 3B illustrate another embodiment of a semiconductor package having a metal clip, where FIG. 3A shows a top plan view of the semiconductor package and FIG. 3B shows a cross-sectional view of the semiconductor package along the line labelled C-C' in FIG. 3A.

FIGS. 4A and 4B illustrate another embodiment of a semiconductor package having a metal clip, where FIG. 4A shows a top plan view of the semiconductor package and FIG. 4B shows a cross-sectional view of the semiconductor package along the line labelled D-D' in FIG. 4A.

FIGS. 5A and 5B illustrate another embodiment of a semiconductor package having a metal clip, where FIG. 5A shows a top plan view of the semiconductor package and FIG. 5B shows a cross-sectional view of the semiconductor package along the line labelled E-E' in FIG. 5A.

DETAILED DESCRIPTION

The embodiments described herein provide a semiconductor package that utilizes a metal clip for a power terminal connection to a semiconductor die included in the package, but which is more robust against shorting due to solder bleed-out. Related methods of manufacturing the semiconductor package are also described. The metal clip is attached to a bond pad of the semiconductor die by a solder joint, for providing an electrical pathway to the die bond pad. An additional electrical pathway is provided to the die bond pad, where a first end of the additional electrical pathway is attached to the die bond pad. At locations between the first end and a second end of the additional electrical pathway, the additional electrical pathway is attached to the metal clip. The additional electrical pathway carries a portion of the current traversing the die bond pad, with the metal clip carrying the majority of the current. Accordingly, less solder may be used to attach the metal clip to the die bond pad while mitigating the impact on resistance associated with the die bond pad (such as $R_{DS,ON}$ if the die bond pad functions as a drain or source terminal). Using less solder reduces the likelihood of electrical shorting caused by solder bleed-out. Providing the additional electrical pathway to the die bond pad ensures the resistance of this electrical pathway is not adversely affected by reducing the amount of solder used to attach the metal clip to the die bond pad.

Described next, with reference to the figures, are exemplary embodiments of the semiconductor package and related methods of manufacturing.

Figure 1A:
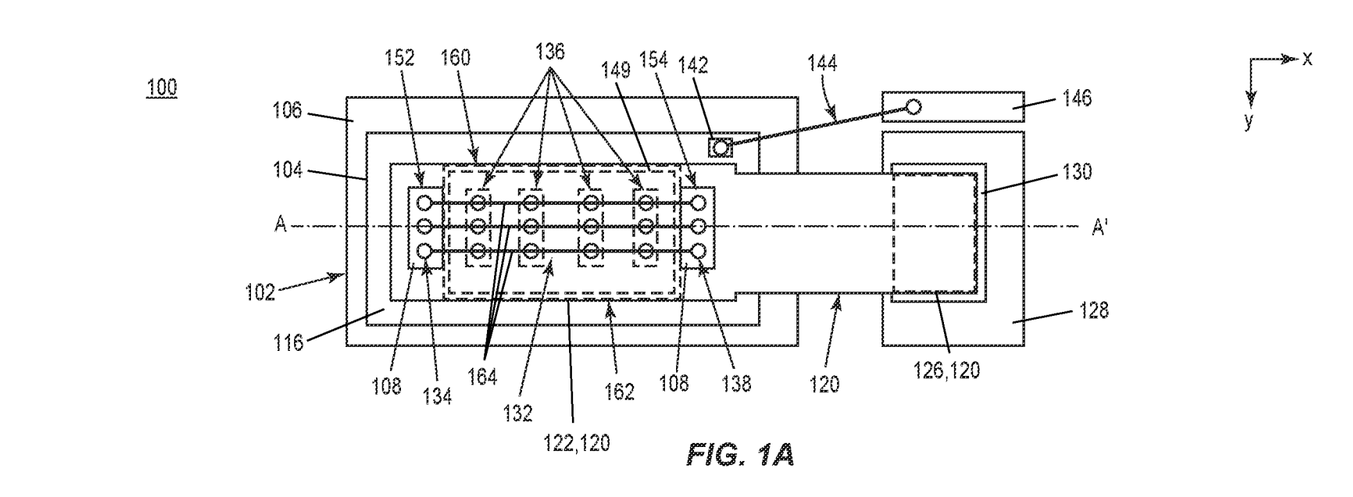
Figure 1B:
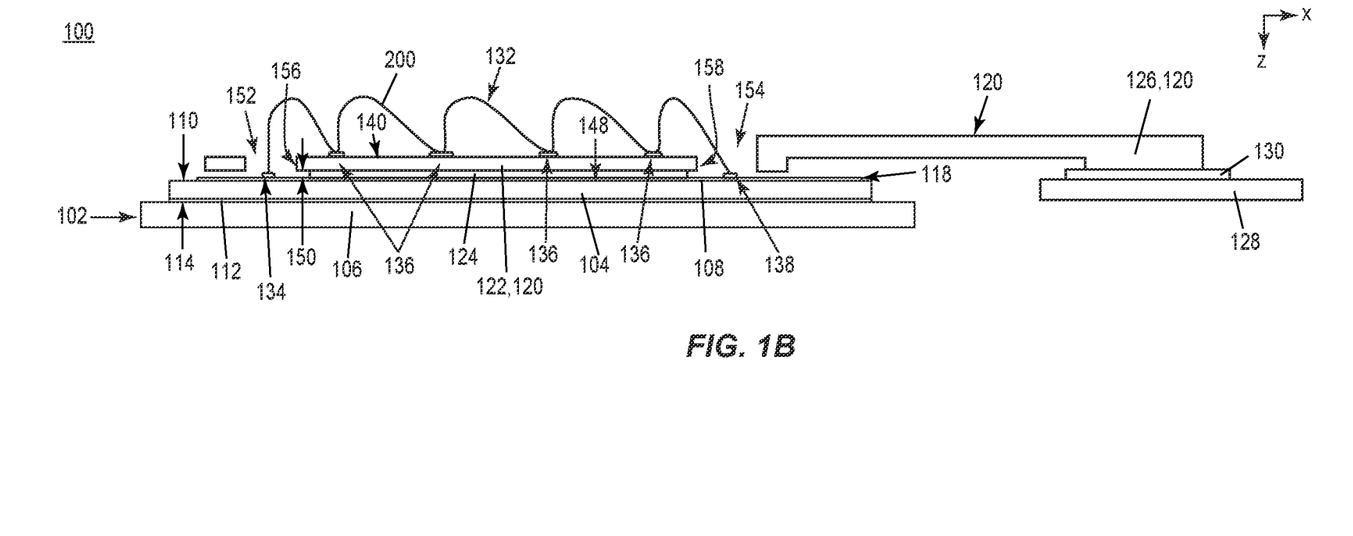

FIGS. 1A and 1B illustrate an embodiment of a semiconductor package 100. FIG. 1A shows a top plan view of the semiconductor package 100. FIG. 1B shows a cross-sectional view of the semiconductor package 100 along the line labelled A-A' in FIG. 1A.

The semiconductor package 100 includes a lead frame 102 and a semiconductor die 104 attached to the lead frame 102. For example, the semiconductor die 104 may be attached to a die paddle 106 of the lead frame 102.

The semiconductor die 104 may be a logic die such as a processor die, memory die, etc., a power semiconductor die such as a power transistor die, a power diode die, a half bridge die, etc., or a die that combines logic and power devices on the same semiconductor substrate. In one embodiment, the semiconductor die 104 is a vertical semiconductor die having a primary current path between a first bond pad 108 at a first side 110 of the semiconductor die 104 facing away from the lead frame 102 and a second bond pad 112 at a second side 114 of the die 104 opposite the first side 110. A passivation layer 116 such as polyimide may laterally surround the first bond pad 108 of the semiconductor die 104 and have an opening 118 which exposes part or all of the first bond pad 108. Examples of vertical power semiconductor dies include but are not limited to power Si MOSFETs (metal-oxide-semiconductor field-effect transistors), IGBTs (insulated-gate bipolar transistors), SiC MOSFETs, GaN HEMTs (high-electron mobility transistors), etc.

The semiconductor package 100 also includes a metal clip 120 such as a Cu (copper) clip. The metal clip 120 has a first bonding region 122 attached to the first bond pad 108 of the semiconductor die 104 by a solder joint 124 and provides an electrical pathway to the first die bond pad 108. A second bonding region 126 of the metal clip 120 may be attached to a metal lead 128 of the lead frame 102 by another solder joint 130, to complete the electrical pathway to the first die bond pad 108. Each solder joint 124, 130 may be formed using a solder paste, a solder preform, a solder preform in combination with a solder paste to fortify the respective solder joint 124, 130, etc.

The semiconductor package 100 also includes an additional electrical pathway 132 to the first bond pad 108 of the semiconductor die 104. A first end 134 of the additional electrical pathway 132 is attached to the first die bond pad 108. At one or more locations 136 between the first end 134 and a second end 138 of the additional electrical pathway 132, the additional electrical pathway 132 is attached to a surface 140 of the first bonding region 122 of the metal clip 120 that faces away from the first bond pad 108 of the semiconductor die 104.

The additional electrical pathway 132 carries a portion of the current traversing the first bond pad 108 of the semiconductor die 104, with the metal clip 120 carrying the majority of the current. Accordingly, the resistance of the connection to the first die bond pad 108 is reduced by providing the additional electrical pathway 132 in parallel with the first bonding region 122 of the metal clip 120. This means that less solder material may be used to form the solder joint 124 between the first bonding region 122 of the metal clip 120 and the first bond pad 108 of the semiconductor die 104 while mitigating the impact on resistance associated with the die bond pad (such as $R_{DS,ON}$ if the die bond pad functions as a drain or source terminal). For example, the solder joint 124 may extend over a smaller surface of the first die bond pad 108. Using less solder reduces the likelihood of electrical shorting caused by solder bleed-out.

The semiconductor die 104 may be a vertical power transistor die as explained above. In this case, the first bond pad 108 is a source pad of the power transistor die 140 and a gate pad 142 is disposed at the same side of the power transistor die 104 as the source pad 108. The gate pad 142 may be electrically connected to another metal lead 144 of the lead frame 102, e.g., by at least bond wire 146. By using less solder material to form the solder joint 124 between the first bonding region 122 of the metal clip 120 and the first bond pad 108 of the semiconductor die 104, the likelihood of electrical shorting between the source pad 108 and the gate pad 142 and caused by solder bleed-out is reduced.

In one embodiment, the solder joint 124 formed between the first bonding region 122 of the metal clip 120 and the first bond pad 108 of the semiconductor die 104 covers less than 100% of the surface 148 of the first die bond pad 108 to which the first bonding region 122 of the metal clip 120 is attached by the solder joint 124, as indicated by the dashed box labelled 149 in FIG. 1A. For example, the solder joint 124 may cover 95% to 99% of the surface 148 of the first die bond pad 108 to which the first bonding region 122 of the metal clip 120 is attached by the solder joint 124.

As shown in the top plan view of FIG. 1A, no solder bleed-out may occur beyond the perimeter of the first bonding region 122 of the metal clip 120. Solder bleed-out may occur at the second bonding region 126 of the metal clip 120 as shown in FIG. 1A, since there is no shorting concern at the corresponding metal lead 128 of the lead frame 102.

As shown in the cross-sectional view of FIG. 1B, a gap 150 may be present between the first bonding region 122 of the metal clip 120 and the outermost part of the first bond pad 108 of the semiconductor die 104, if the solder joint 124 formed between the first bonding region 122 of the metal clip 120 and the first die bond pad 108 covers less than 100% of the surface 148 of the first die bond pad 108 to which the first bonding region 122 of the metal clip 120 is attached by the solder joint 124. The thickness/height of the gap 150 is exaggerated in FIG. 1B and corresponds to the bond line thickness of the solder joint 124 formed between the first bonding region 122 of the metal clip 120 and the first bond pad 108 of the semiconductor die 104.

According to the embodiment illustrated in FIGS. 1A and 1B, the first end 134 of the additional electrical pathway 132 that allows for the use of a smaller solder joint 124 between the first bonding region 122 of the metal clip 120 and the first bond pad 108 of the semiconductor die 104 is attached to the first die bond pad 108 through a first opening 152 in the metal clip 120. The second end 138 of the additional electrical pathway 132 is attached to the first die bond pad 108 through a second opening 154 in the metal clip 120.

Also as shown in FIGS. 1A and 1B, the additional electrical pathway 132 may run parallel to a longitudinal dimension (x direction in FIGS. 1A and 1B) of the metal clip 120. In one embodiment, the first bonding region 122 of the metal clip 120 has a rectangular shape with parallel first and second side faces 156, 158 and parallel third and fourth side faces 160, 162. The third and fourth side faces 160, 162 are longer than the first and second side faces 156, 158 in FIGS. 1A and 1B. The first end 134 of the additional electrical pathway 132 is attached to the first bond pad 108 of the semiconductor die 104 through the first opening 152 in the metal clip 120 near the first (shorter) side face 156 of the first bonding region 122 of the metal clip 120. The second end 138 of the additional electrical pathway 132 may be attached to the first die bond pad 108 through the second opening 154 in the metal clip 120 near the second (shorter) side face 158 of the first bonding region 122 of the metal clip 120.

According to the embodiment illustrated in FIGS. 1A and 1B, the additional electrical pathway 132 that allows for the use of a smaller solder joint 124 between the first bonding region 122 of the metal clip 120 and the first bond pad 108 of the semiconductor die 104 is implemented as bond wires 164. The bond wires 164 are bonded to the surface 140 of the first bonding region 122 of the metal clip 120 that faces away from the first bond pad 108 of the semiconductor die 104, at one or more locations 136 between the first end 134 and the second end 138 of the additional electrical pathway 132. Three (3) bond wires 164 are shown in FIG. 1A. More generally, two or more bond wires 164 may be used to implement the additional electrical pathway 132. The bond wires 164 may be ball bonded, wedge bonded, or a combination of ball bonded and wedge bonded to the first bonding region 122 of the metal clip 120 and to the first bond pad 108 of the semiconductor die 104.

Figure 2A:
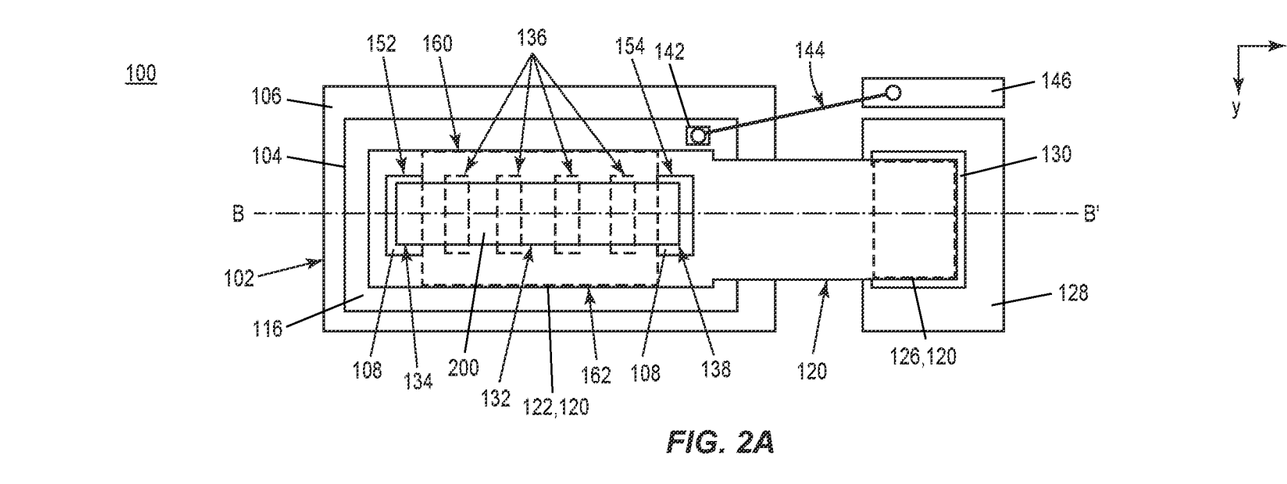
Figure 2B:
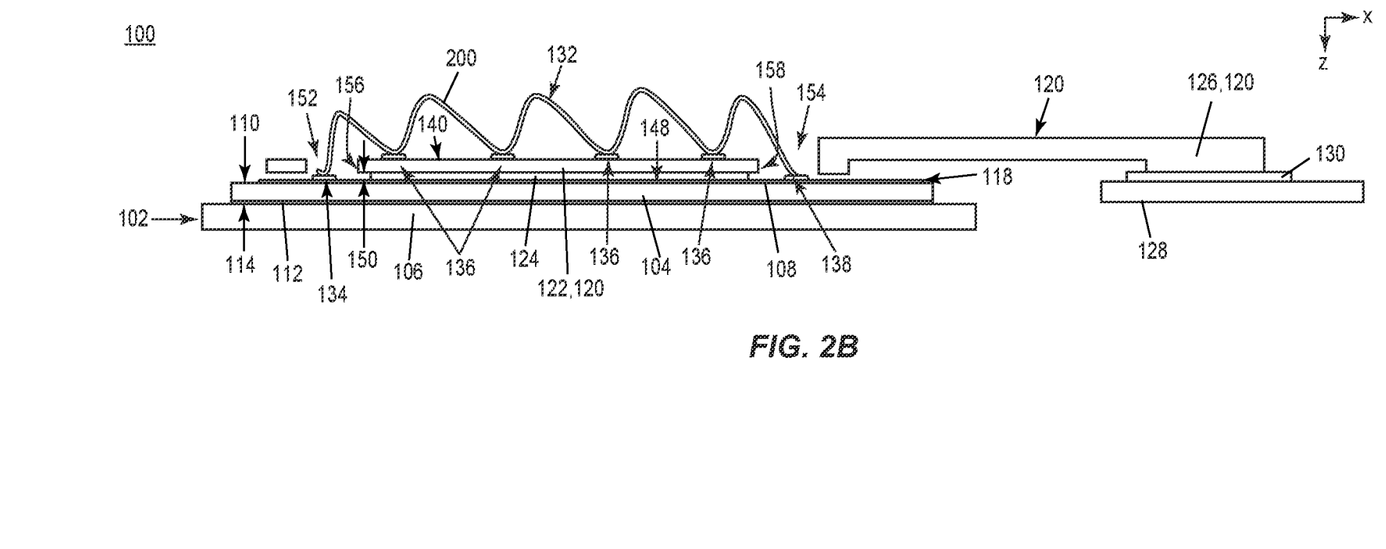

FIGS. 2A and 2B illustrate another embodiment of the semiconductor package 100. FIG. 2A shows a top plan view of the semiconductor package 100. FIG. 2B shows a cross-sectional view of the semiconductor package 100 along the line labelled B-B' in FIG. 2A.

The embodiment shown in FIGS. 2A and 2B is similar to the embodiment shown in FIGS. 1A and 1B. In FIGS. 2A and 2B, the additional electrical pathway 132 is implemented as at least one ribbon wire 200. Each ribbon wire 200 is bonded to the surface 140 of the first bonding region 122 of the metal clip 132 that faces away from the first die bond pad 108 at one or more locations 136 between the first end 134 and the second end 138 of the additional electrical pathway 132. A single (1) ribbon wire 200 is shown in FIG. 2A. More generally, one or more ribbon wires 200 may be used to implement the additional electrical pathway 132. Each ribbon wire 200 may be, e.g., wedge bonded to the first bonding region 122 of the metal clip 120 and to the first bond pad 108 of the semiconductor die 104.

Figure 3A:
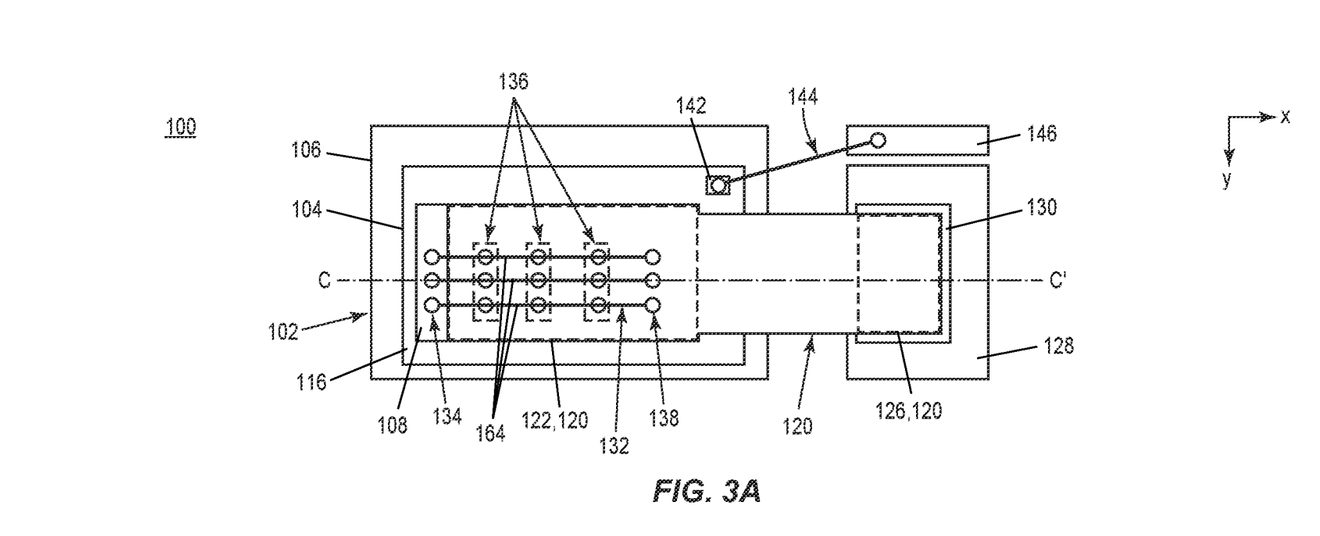
Figure 3B:
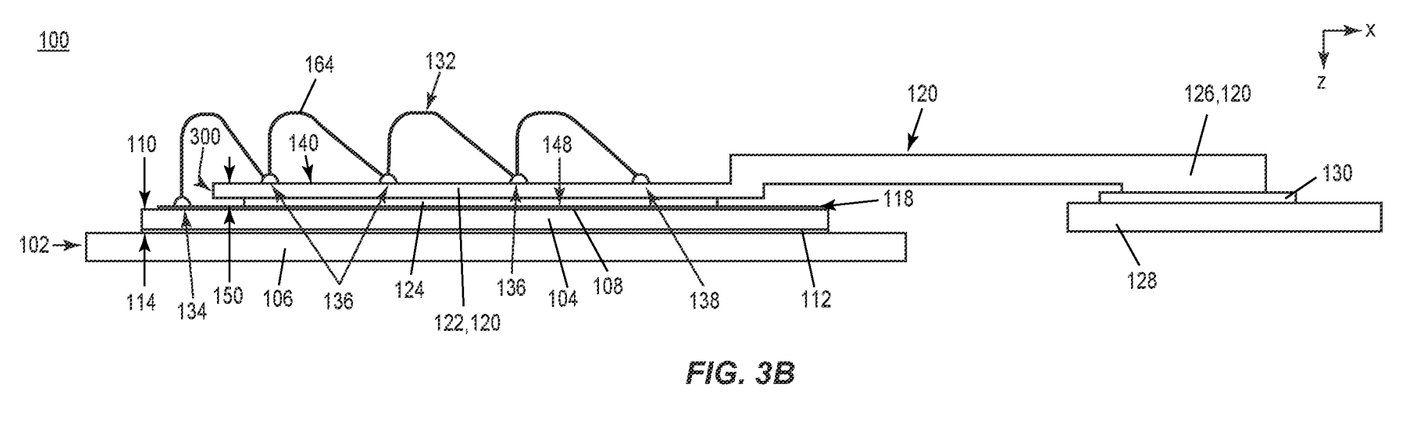

FIGS. 3A and 3B illustrate another embodiment of the semiconductor package 100. FIG. 3A shows a top plan view of the semiconductor package 100. FIG. 3B shows a cross-sectional view of the semiconductor package 100 along the line labelled C-C' in FIG. 3A.

The embodiment shown in FIGS. 3A and 3B is similar to the embodiment shown in FIGS. 1A and 1B. In FIGS. 3A and 3B, the first end 134 of the additional electrical pathway 132 is attached to the first die bond pad 108 beyond the boundary/edge 300 of the metal clip 120. The second end 138 of the additional electrical pathway 132 is attached to the surface 140 of the first bonding region 122 of the metal clip 120 that faces away from the first bond pad 108 of the semiconductor die 104. The additional electrical pathway 132 also is attached to the surface 140 of the first bonding region 122 of the metal clip 120 that faces away from the first bond pad 108 of the semiconductor die 104 at one or more locations 136 between the first and second ends 134, 138 of the additional electrical pathway 132. The additional electrical pathway 132 is implemented as bond wires 164 in FIGS. 3A and 3B. The additional electrical pathway 132 instead may be implemented as one or ribbon wires, e.g., as shown in FIGS. 2A and 2B.

Figure 4A:
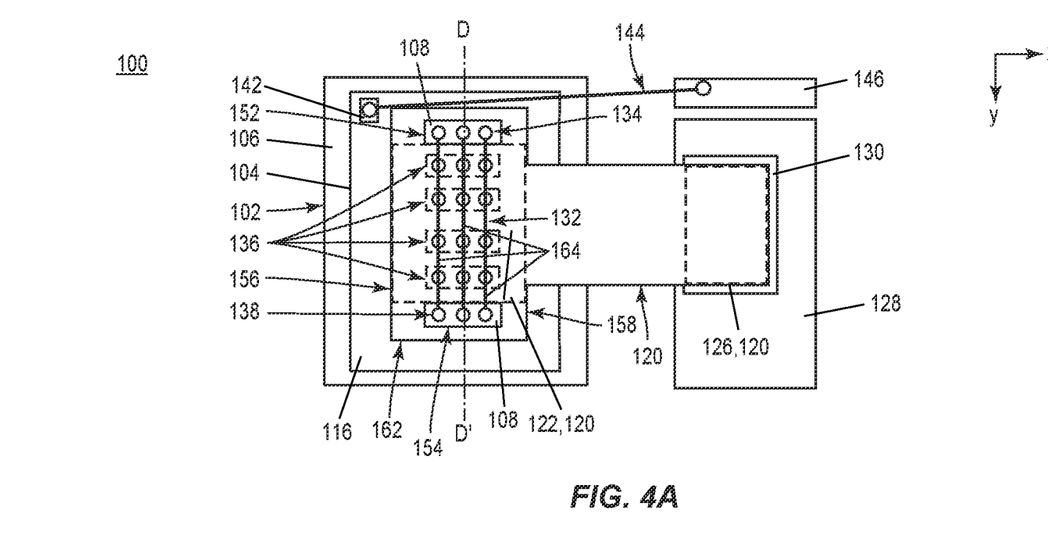
Figure 4B:
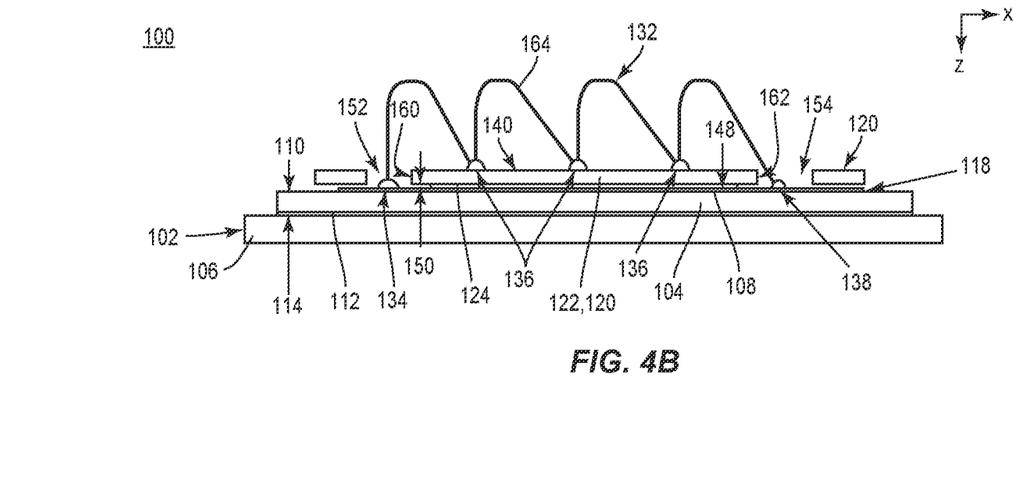

FIGS. 4A and 4B illustrate another embodiment of the semiconductor package 100. FIG. 4A shows a top plan view of the semiconductor package 100. FIG. 4B shows a cross-sectional view of the semiconductor package 100 along the line labelled D-D' in FIG. 4A.

The embodiment shown in FIGS. 4A and 4B is similar to the embodiment shown in FIGS. 1A and 1B. In FIGS. 4A and 4B, the metal clip 120 has a T-shape and the first bonding region 122 of the metal clip 120 has a rectangular shape with the third and fourth parallel side faces 160, 162 being shorter than the first and second parallel side faces 156, 158. The first end 134 of the additional electrical pathway 132 is attached to the first bond pad 108 of the semiconductor die 104 through a first opening 152 in the metal clip 120 near the third (shorter) side face 160 of the first bonding region 122. The second end 138 of the additional electrical pathway 132 is attached to the first die bond pad 108 through a second opening 154 in the metal clip 120 near the fourth (shorter) side face 162 of the first bonding region 122. The additional electrical pathway 132 is implemented as bond wires 164 in FIGS. 4A and 4B. The additional electrical pathway 132 instead may be implemented as one or ribbon wires, e.g., as shown in FIGS. 2A and 2B.

Figure 5A:
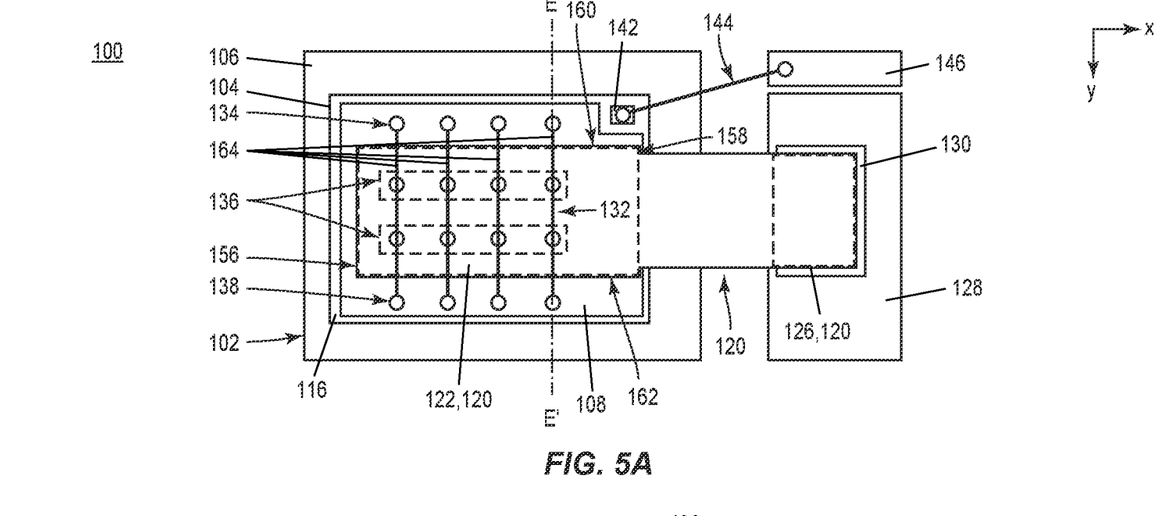
Figure 5B:
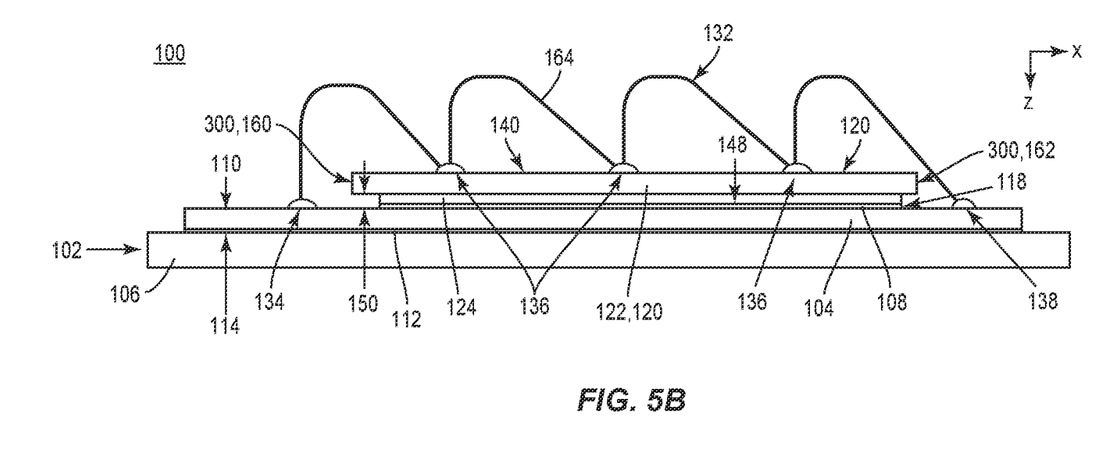

FIGS. 5A and 5B illustrate another embodiment of the semiconductor package 100. FIG. 5A shows a top plan view of the semiconductor package 100. FIG. 5B shows a cross-sectional view of the semiconductor package 100 along the line labelled E-E' in FIG. 5A.

The embodiment shown in FIGS. 5A and 5B is similar to the embodiment shown in FIGS. 1A and 1B. In FIGS. 5A and 5B, the additional electrical pathway 132 runs transverse (y direction in FIG. 5A) to a longitudinal dimension (x direction in FIG. 5A) of the metal clip 102. The first end 134 of the additional electrical pathway 132 is attached to the first bond pad 108 of the semiconductor die 104 beyond the third (longer) side face 160 of the first bonding region 122 of the metal clip 120. The second end 138 of the additional electrical pathway 132 is attached to the first die bond pad 108 beyond the fourth (longer) side face 162 of the first bonding region 122 of the meta clip 120. The additional electrical pathway 132 is implemented as bond wires 164 in FIGS. 5A and 5B. The additional electrical pathway 132 instead may be implemented as one or ribbon wires, e.g., as shown in FIGS. 2A and 2B.

Although the present disclosure is not so limited, the following numbered examples demonstrate one or more aspects of the disclosure.

Example 1. A semiconductor package, comprising: a semiconductor die attached to a lead frame and having a first bond pad at a side of the semiconductor die facing away from the lead frame; a metal clip having a first bonding region attached to the first bond pad by a solder joint, the metal clip providing an electrical pathway to the first bond pad; and an additional electrical pathway to the first bond pad, wherein a first end of the additional electrical pathway is attached to the first bond pad, wherein at one or more locations between the first end and a second end of the additional electrical pathway, the additional electrical pathway is attached to a surface of the first bonding region of the metal clip that faces away from the first bond pad.

Example 2. The semiconductor package of example 1, wherein the first end of the additional electrical pathway is attached to the first bond pad beyond a boundary of the metal clip.

Example 3. The semiconductor package of example 2, wherein the second end of the additional electrical pathway is attached to a surface of the first bonding region of the metal clip that faces away from the first bond pad.

Example 4. The semiconductor package of example 1, wherein the first end of the additional electrical pathway is attached to the first bond pad through a first opening in the metal clip.

Example 5. The semiconductor package of example 4, wherein the second end of the additional electrical pathway is attached to the first bond pad through a second opening in the metal clip.

Example 6. The semiconductor package of examples 1, 2 and 4, wherein the second end of the additional electrical pathway is attached to the first bond pad beyond a boundary of the metal clip.

Example 7. The semiconductor package of examples 1, 2 and 4, wherein the second end of the additional electrical pathway is attached to the first bond pad through an opening in the metal clip.

Example 8. The semiconductor package of any of examples 1 through 7, wherein the additional electrical pathway comprises a plurality of bond wires bonded to the surface of the first bonding region of the metal clip that faces away from the first bond pad, at the plurality of locations between the first end and the second end of the additional electrical pathway.

Example 9. The semiconductor package of any of examples 1 through 7, wherein the additional electrical pathway comprises at least one ribbon wire bonded to the surface of the first bonding region of the metal clip that faces away from the first bond pad, at the plurality of locations between the first end and the second end of the additional electrical pathway.

Example 10. The semiconductor package of any of examples 1 through 9, wherein the additional electrical pathway runs parallel to a longitudinal dimension of the metal clip.

Example 11. The semiconductor package of example 10, wherein the first bonding region of the metal clip has a rectangular shape with parallel first and second side faces and parallel third and fourth side faces, wherein the third and fourth side faces are longer than the first and second side faces, wherein the first end of the additional electrical pathway is attached to the first bond pad through a first opening in the metal clip near the first side face of the first bonding region, and wherein the second end of the additional electrical pathway is attached to the first bond pad through a second opening in the metal clip near the second side face of the first bonding region.

Example 12. The semiconductor package of any of examples 1 through 9, wherein the additional electrical pathway runs transverse to a longitudinal dimension of the metal clip.

Example 13. The semiconductor package of example 12, wherein the first bonding region of the metal clip has a rectangular shape with parallel first and second side faces and parallel third and fourth side faces, wherein the third and fourth side faces are longer than the first and second side faces, wherein the first end of the additional electrical pathway is attached to the first bond pad beyond the third side face of the first bonding region, and wherein the second end of the additional electrical pathway is attached to the first bond pad beyond the fourth side face of the first bonding region.

Example 14. The semiconductor package of any of examples 1 through 13, wherein a second bonding region of the metal clip is attached to a metal lead of the lead frame.

Example 15. The semiconductor package of any of examples 1 through 14, wherein the semiconductor die is a power transistor die, wherein the first bond pad is a source pad of the power transistor die, and wherein a gate pad at the same side of the power transistor die as the source pad is electrically connected to a metal lead of the lead frame by at least bond wire.

Example 16. The semiconductor package of any of examples 1 through 15, wherein the solder joint covers less than 100% of a surface of the first bond pad to which the first bonding region of the metal clip is attached by the solder joint.

Example 17. The semiconductor package of example 16, wherein the solder joint covers 95% to 99% of the surface of the first bond pad to which the first bonding region of the metal clip is attached by the solder joint.

Example 18. A method of producing a semiconductor package, the method comprising: attaching a semiconductor die to a lead frame, the semiconductor die having a first bond pad at a side of the semiconductor die facing away from the lead frame; attaching a first bonding region of a metal clip to the first bond pad by a solder joint, the metal clip providing an electrical pathway to the first bond pad; attaching a first end of an additional electrical pathway to the first bond pad; and at one or more locations between the first end and a second end of the additional electrical pathway, attaching the additional electrical pathway to a surface of the first bonding region of the metal clip that faces away from the first bond pad.

Example 19. The method of example 18, wherein attaching the first end of the additional electrical pathway to the first bond pad comprises: attaching the first end of the additional electrical pathway to the first bond pad beyond a boundary of the metal clip.

Example 20. The method of example 19, further comprising: attaching the second end of the additional electrical pathway to a surface of the first bonding region of the metal clip that faces away from the first bond pad.

Example 21. The method of example 18, wherein attaching the first end of the additional electrical pathway to the first bond pad comprises: attaching the first end of the additional electrical pathway to the first bond pad through a first opening in the metal clip.

Example 22. The method of example 21, further comprising: attaching the second end of the additional electrical pathway to the first bond pad through a second opening in the metal clip.

Example 23. The method of example 21, further comprising: attaching the second end of the additional electrical pathway to the first bond pad beyond a boundary of the metal clip.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a semiconductor die attached to a lead frame and having a first bond pad at a side of the semiconductor die facing away from the lead frame;
a metal clip having a first bonding region attached to the first bond pad by a solder joint, the metal clip providing an electrical pathway to the first bond pad; and
an additional electrical pathway to the first bond pad, wherein a first end of the additional electrical pathway is attached to the first bond pad,
wherein at one or more locations between the first end and a second end of the additional electrical pathway, the additional electrical pathway is attached to a surface of the first bonding region of the metal clip that faces away from the first bond pad.

2. The semiconductor package of claim 1, wherein the first end of the additional electrical pathway is attached to the first bond pad beyond a boundary of the metal clip.

3. The semiconductor package of claim 2, wherein the second end of the additional electrical pathway is attached to a surface of the first bonding region of the metal clip that faces away from the first bond pad.

4. The semiconductor package of claim 1, wherein the first end of the additional electrical pathway is attached to the first bond pad through a first opening in the metal clip.

5. The semiconductor package of claim 4, wherein the second end of the additional electrical pathway is attached to the first bond pad through a second opening in the metal clip.

6. The semiconductor package of claim 1, wherein the second end of the additional electrical pathway is attached to the first bond pad beyond a boundary of the metal clip.

7. The semiconductor package of claim 1, wherein the second end of the additional electrical pathway is attached to the first bond pad through an opening in the metal clip.

8. The semiconductor package of claim 1, wherein the additional electrical pathway comprises a plurality of bond wires bonded to the surface of the first bonding region of the metal clip that faces away from the first bond pad, at the plurality of locations between the first end and the second end of the additional electrical pathway.

9. The semiconductor package of claim 1, wherein the additional electrical pathway comprises at least one ribbon wire bonded to the surface of the first bonding region of the metal clip that faces away from the first bond pad, at the plurality of locations between the first end and the second end of the additional electrical pathway.

10. The semiconductor package of claim 1, wherein the additional electrical pathway runs parallel to a longitudinal dimension of the metal clip.

11. The semiconductor package of claim 10, wherein the first bonding region of the metal clip has a rectangular shape with parallel first and second side faces and parallel third and fourth side faces, wherein the third and fourth side faces are longer than the first and second side faces, wherein the first end of the additional electrical pathway is attached to the first bond pad through a first opening in the metal clip near the first side face of the first bonding region, and wherein the second end of the additional electrical pathway is attached to the first bond pad through a second opening in the metal clip near the second side face of the first bonding region.

12. The semiconductor package of claim 1, wherein the additional electrical pathway runs transverse to a longitudinal dimension of the metal clip.

13. The semiconductor package of claim 12, wherein the first bonding region of the metal clip has a rectangular shape with parallel first and second side faces and parallel third and fourth side faces, wherein the third and fourth side faces are longer than the first and second side faces, wherein the first end of the additional electrical pathway is attached to the first bond pad beyond the third side face of the first bonding region, and wherein the second end of the additional electrical pathway is attached to the first bond pad beyond the fourth side face of the first bonding region.

14. The semiconductor package of claim 1, wherein a second bonding region of the metal clip is attached to a metal lead of the lead frame.

15. The semiconductor package of claim 1, wherein the semiconductor die is a power transistor die, wherein the first bond pad is a source pad of the power transistor die, and wherein a gate pad at the same side of the power transistor die as the source pad is electrically connected to a metal lead of the lead frame by at least bond wire.

16. The semiconductor package of claim 1, wherein the solder joint covers less than 100% of a surface of the first bond pad to which the first bonding region of the metal clip is attached by the solder joint.

17. The semiconductor package of claim 16, wherein the solder joint covers 95% to 99% of the surface of the first bond pad to which the first bonding region of the metal clip is attached by the solder joint.

18. A method of producing a semiconductor package, the method comprising:
attaching a semiconductor die to a lead frame, the semiconductor die having a first bond pad at a side of the semiconductor die facing away from the lead frame;
attaching a first bonding region of a metal clip to the first bond pad by a solder joint, the metal clip providing an electrical pathway to the first bond pad;
attaching a first end of an additional electrical pathway to the first bond pad; and
at one or more locations between the first end and a second end of the additional electrical pathway, attaching the additional electrical pathway to a surface of the first bonding region of the metal clip that faces away from the first bond pad.

19. The method of claim 18, wherein attaching the first end of the additional electrical pathway to the first bond pad comprises:
attaching the first end of the additional electrical pathway to the first bond pad beyond a boundary of the metal clip.

20. The method of claim 19, further comprising:
attaching the second end of the additional electrical pathway to a surface of the first bonding region of the metal clip that faces away from the first bond pad.

21. The method of claim 18, wherein attaching the first end of the additional electrical pathway to the first bond pad comprises:
attaching the first end of the additional electrical pathway to the first bond pad through a first opening in the metal clip.

22. The method of claim 21, further comprising:
attaching the second end of the additional electrical pathway to the first bond pad through a second opening in the metal clip.

23. The method of claim 21, further comprising:
attaching the second end of the additional electrical pathway to the first bond pad beyond a boundary of the metal clip.

* * * * *